United States Patent [19]

Schwartz, deceased

[11] Patent Number: 4,513,396
[45] Date of Patent: Apr. 23, 1985

[54] METHOD OF OPERATING A MAGNETIC BUBBLE MEMORY WITH A DRIVE FIELD THAT TEMPORARILY STOPS

[75] Inventor: Sidney J. Schwartz, deceased, late of Vista, Calif., by Marie A. Schwartz, legal representative

[73] Assignee: Burroughs Corporation, Detroit, Mich.

[21] Appl. No.: 508,947

[22] Filed: Jun. 29, 1983

[51] Int. Cl.³ .............................................. G11C 19/08
[52] U.S. Cl. ........................................... 365/6; 365/7
[58] Field of Search ............................. 365/6, 7, 157

[56] References Cited

U.S. PATENT DOCUMENTS

| | | | |
|---|---|---|---|
| 3,763,478 | 10/1973 | Yoshizawa et al. | 365/6 |
| 4,094,003 | 6/1978 | Kinsner et al. | 365/7 |
| 4,283,775 | 11/1981 | Cohen | 365/37 |
| 4,443,867 | 4/1984 | Boshra-Riad et al. | 365/19 |

Primary Examiner—James W. Moffitt
Attorney, Agent, or Firm—Charles J. Fassbender; Kevin R. Peterson

[57] ABSTRACT

A method of operating a magnetic bubble memory (of the type that has a plurality of magnetic bubbles which move in a plane in response to a magnetic drive field that rotates in said plane) includes the steps of sending respective currents through a pair of field coils to produce the rotating magnetic field; generating at least one of the currents to consist of a series of positive and negative going waveforms separated by a dwell period so that the rotation of the field temporarily stops during the dwell period; and timing the dwell period to occur when the bubbles are at predetermined locations in the memory.

10 Claims, 7 Drawing Figures

METHOD OF OPERATING A MAGNETIC BUBBLE MEMORY WITH A DRIVE FIELD THAT TEMPORARILY STOPS

BACKGROUND OF THE INVENTION

This invention relates to magnetic bubble memories; and, more particularly, it relates to methods of generating a rotating magnetic field for moving the bubbles from one location to another in such memories.

A bubble memory is comprised of a thin planar film of magnetic material in which bubbles are generated by a magnetic field that points perpendicular to the plane of the film. An insulating layer lies over the thin film of magnetic material; and a plurality of propagate elements are disposed on the insulating layer to define paths beneath which the bubbles move. Those bubbles are moved in the film of magnetic material in response to another magnetic field that rotates in the plane of the film.

Typically, the propagate elements are shaped like asymmetric chevrons. They have a relatively wide end and a relatively narrow end; and they lie along the path of propagation in an end-to-end fashion with each chevron's relatively narrow end being spaced apart from the next succeeding chevron's relatively wide end.

Also included in the bubble memory is a magnetic bubble detector which contains a magnetostrictive sensing element. In operation, bubbles are propagated under the sensing element in response to the rotating magnetic field whereupon the bubbles induce a resistance change into the sensing element. That resistance change then indicates the presence (or absence) of a bubble.

Now, in the above-described bubble memory, the ease with which a bubble moves from one end of a propagate element to the other end and then to the next succeeding propagate element is not uniform. In particular, movement of the bubble becomes quite difficult as it crosses the space between propagate elements.

Also in the above-described bubble memory, the magnitude of the resistance change that is induced by a bubble in the sensing element is quite small; and that resistance change lasts for only a relatively short time. Thus, sensing such resistance change is quite difficult.

Accordingly, a primary object of the invention is to provide a method of operating a magnetic bubble memory system which improves the ease with which a bubble moves from one propagate element to another.

Another object of the invention is to provide a method of operating a magnetic bubble memory system which improves the ease with which a bubble is detected in a bubble detector.

BRIEF SUMMARY OF THE INVENTION

In the present invention, the above objects and others are achieved by sending respective currents through a pair of field coils to produce a magnetic drive field which moves the bubbles by rotating in the plane of the magnetic film—wherein at least one of the currents through the field coils is generated to consist of a series of positive and negative going waveforms which are separated by a dwell period so that the rotation of the field temporarily stops during the dwell period, and wherein the dwell period is timed to occur when the bubbles move across the spaces between the propagate elements and beneath the sensing element in a bubble detector. Preferably, the time duration of the dwell period in the current is at least one-ninth of the time duration between consecutive dwell periods. Also, the current waveform with the dwell period preferably is generated by a sequential discharge of two capacitors with the dwell period occurring between the discharging of one capacitor and the other. Also preferably, during the dwell period of one current waveform, the magnitude of the other current waveform increases to a predetermined maximum.

BRIEF DESCRIPTION OF THE DRAWINGS

Various features and advantages of the invention are described in the following Detailed Description in conjunction with the accompanying drawings wherein.

DETAILED DESCRIPTION OF THE INVENTION

Figure 1:
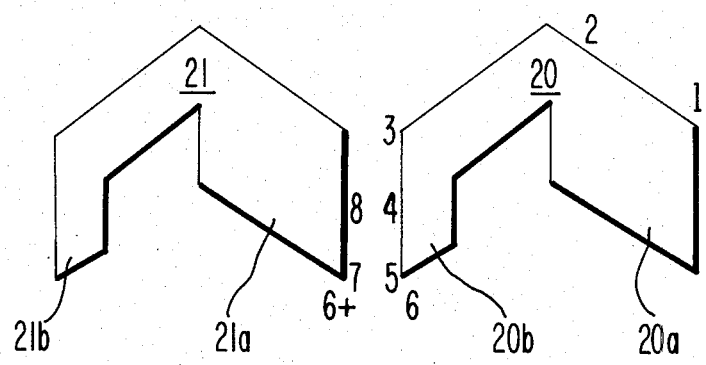
FIG. 1 illustrates the propagation of a bubble along two propagate elements in response to a rotating magnetic field.
Figure 1:
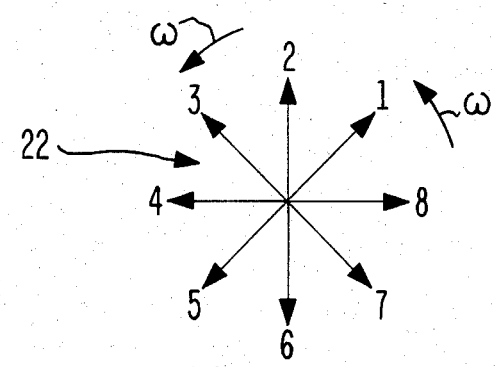

Referring now to the figures, the steps of the disclosed process will be described. To begin, FIG. 1 illustrates a pair of propagate elements 20 and 21 which comprise a portion of a bubble memory system in which the disclosed process is carried out. Specifically, elements 20 and 21 are used in conjunction with a plurality of other identical propagate elements (not shown) to define planar paths along which magnetic bubbles move in alignment with a magnetic drive field that rotates in the plane of the paths. In FIG. 1, reference numeral 22 indicates one such rotating magnetic drive field.

Each of the propagate elements is shaped as an asymmetric chevron which has a relatively wide end (notated by the letter "a") and a relatively narrow end (notated by the letter "b"). To define a propagate path for the magnetic bubbles, the propagate elements are placed along the path in an end-to-end fashion such that each chevron's relatively narrow end (e.g., 20b) lies spaced apart from the next succeeding chevron's relatively wide end (e.g., 21a).

Each of the chevrons is comprised of a permalloy material. In operation, that permalloy material magnetizes in response to the rotating magnetic field 22. In turn, the magnetized chevrons attract the magnetic bubbles in such a way that they propagate from one chevron to another in alignment with the rotating field.

In FIG. 1, reference numerals 1 through 8 identify various positions of field 22. Also, those same reference numerals 1 through 8 identify corresponding positions of the magnetic bubbles as they move along the chevrons 20 and 21 in response to field 22. In other words, when field 22 is in position 1, then any magnetic bubble which is traveling along chevron 20 will also be at position 1; and when field 22 is at position 2, then the bubble will be at position 2; etc.

As the bubble moves from position 1 to position 5 along chevron 20, only chevron 20 attracts the bubble. However, when the rotating magnetic field 22 reaches position 6, then chevrons 20 and 21 are magnetized such that they both attract the bubble.

Also in position 6, the magnitude of the respective attractive forces which chevrons 20 and 21 generate are proportional to the magnitude of field 22 and the physical size of the respective chevron ends 20b and 21a. End 21a is larger than end 20b. Thus, when field 22 is in position 6, the bubble moves from chevron 20 to chevron 21.

Thereafter, as field 22 rotates through positions 7 and 8, the magnetic bubble also moves to positions 7 and 8 on chevron 21. During this movement, only chevron 21 generates an attractive force for the magnetic bubble.

Figure 2:
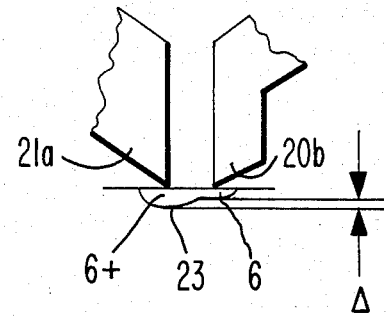
FIG. 2 illustrates the magnitude of the magnetic forces which move a bubble between two propagate elements.

FIG. 2 shows the above described movement of the bubble in position 6 in greater detail. Specifically, this figure illustrates the chevron ends 20b and 21a along with a curve 23 showing the attractive forces that those chevron ends generate when the rotating field is in position 6. By inspection of curve 23 it can been seen that movement of the bubble from end 20b to end 21a is quite difficult since during that movement, the bubble is attracted by both of the ends 20b and 21a so the bubble movement is only due to the difference in those attractive forces.

In the presently disclosed method, the magnitude of the difference is increased; and further, the time duration at which the rotating field 22 stays in position 6 is also increased. Thus, movement of the bubble from end 20b to end 21a can occur without malfunction. Details of how this is achieved are described below in conjunction with FIGS. 4 through 7.

Figure 3:
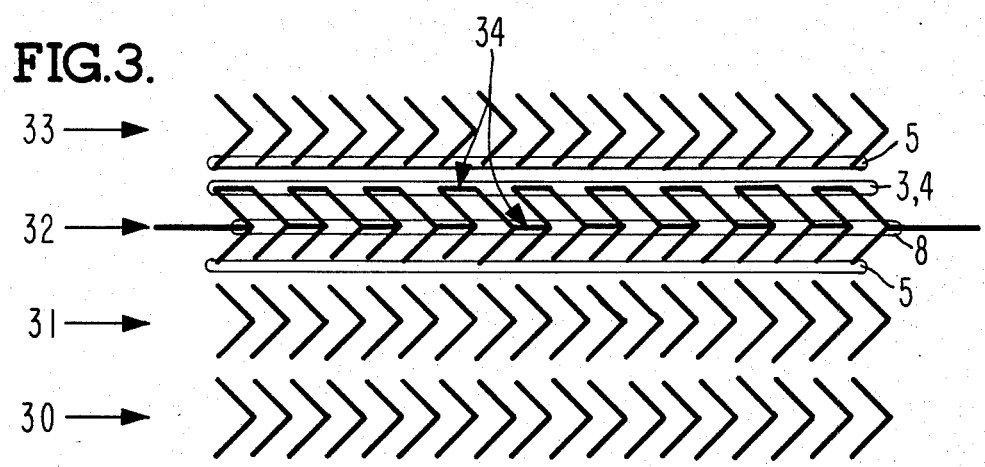
FIG. 3 illustrates the movement of a bubble through a bubble detector.
Figure 4:
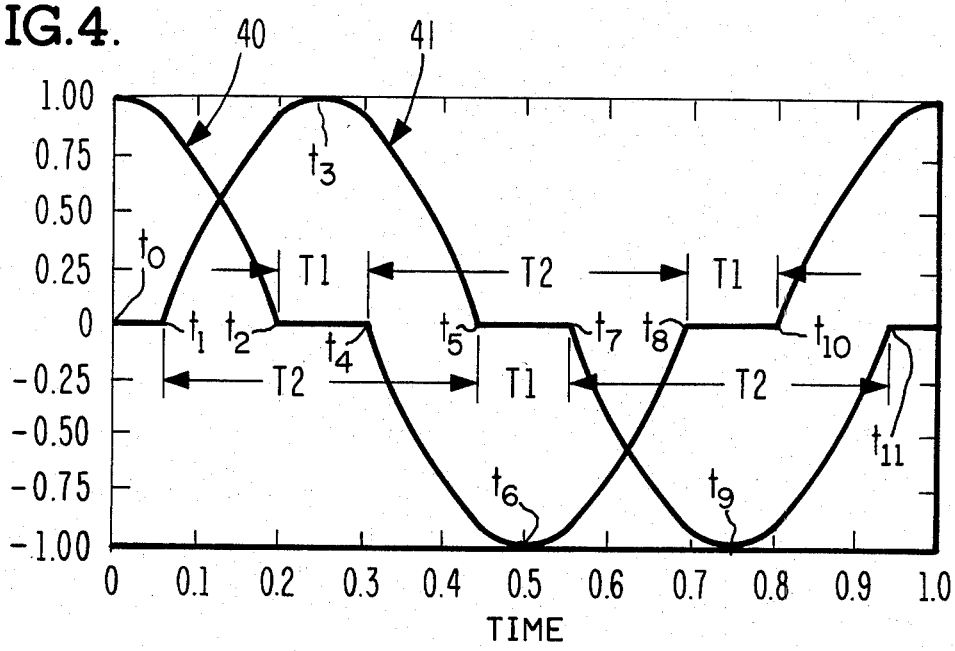
FIG. 4 illustrates the currents which in this invention are sent through field coils to produce a magnetic field that moves the bubbles.

Before proceeding with that description, however, reference should be made to FIG. 3 wherein a bubble detector is illustrated which has an improved bubble detecting capability when operated in accordance with the present invention. This bubble detector consists of several rows 30, 31, 32, and 33 of symmetric chevrons which again are spaced apart from one another. Also, in row 31, a magnetostrictive sensing element 34 is provided which interconnects the spaced apart chevrons of that row in a zig-zag manner.

In operation, bubbles move in response to field 22 from one row to the next. During this movement, the bubbles are stretched (striped out) such that they extend from one end of the row to the other. Then, as the striped out bubbles move under the magnetostrictive sensing element 34, the bubbles induce a change in resistance in element 34 which indicates the bubbles' presence.

In detail, this bubble detection occurs as follows. When field 22 is in position 5, the striped out bubble is in row 32 at position 5. Then when field 22 rotates from position 5 to position 8, the striped out bubble moves in row 32 from position 5 to position 8. At that position, the bubble underlies a portion of the magnetostrictive sensing element 34 and thereby induces a change in resistance in that element.

Thereafter, as the rotating magnetic field 22 moves from position 8 to position 3, the striped out bubble also moves in row 32 from position 8 to position 3. In that position, the striped out bubble again underlies another portion of the magnetostrictive sensing element 34 and thus induces a resistive change into that element. As field 22 rotates to position 4, the position of the striped out bubble remains unchanged since the chevrons are symmetrical and thus only attract the bubble equally. Then, as field 22 moves to position 5, the striped out bubble moves from position 4 in row 32 to position 5 in row 33.

These resistive changes which are induced in the magnetostrictive sensing element 34 are proportional to both the length and the width of the bubble when it is under element 34. And in accordance with the present invention, sensing is improved by increasing the bubble's width.

Also, the resistance changes that are induced in element 34 last for only the period of time that the bubble underlies that element. So, the element's resistance must be sampled at the proper time to detect a bubble. And in the present invention, such sampling is simplified by temporarily stopping the bubble's movement as it passes directly under element 34.

How all of the above is achieved will now be described in greater detail in conjunction with FIGS. 4–7. First, beginning with FIG. 4, there is illustrated a pair of current waveforms 40 and 41 which generate field 22. Specifically, to generate field 22, a pair of orthogonal field coils (not shown) are provided which encompass the bubble propagate elements of FIG. 1 and the detector of FIG. 3; and current waveform 40 is sent through one field coil while current waveform 41 is sent through the other field coil.

Both of the waveforms 40 and 41 consist of a sequence of positive and negative going half-sine waves which are separated by a dwell period T1. Preferably, the time duration of period T1 is at least one-ninth of the time interval T2 between consecutive dwell periods. Also, waveforms 40 and 41 are out of phase with each other such that waveform 41 lags waveform 40 by 90°.

Figure 5:
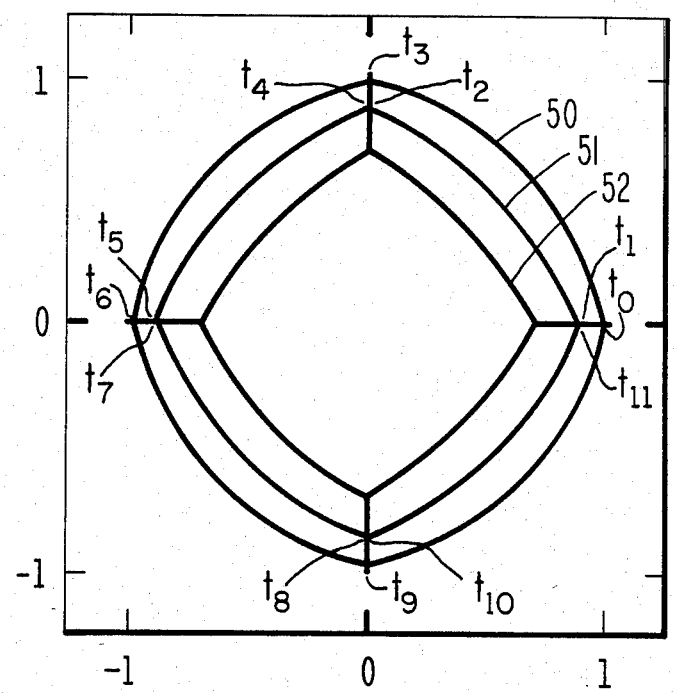
FIG. 5 illustrates the magnetic field that is produced by the currents of FIG. 4.

A computer plot of the rotating field that is generated by current waveforms 40 and 41 is illustrated in FIG. 5. Specifically, in FIG. 5, reference numeral 50 indicates the field that is produced by waveforms 40 and 41 when dwell period T1 is one-ninth of time interval T2; reference numeral 51 indicates the field that is produced when period T1 is two-ninths of T2; and reference numeral 52 indicates the field that is produced when period T1 is three-ninths of the T2. In all cases, the total time T1+T2 remains constant.

Inspection of FIG. 5 shows that the effect of the dwell period T1 is to temporarily stop the rotation of the magnetic field. This is evident by comparing the current waveforms 40 and 41 at time instants $t_0$ through $t_{11}$ to field 51 at the corresponding time instants.

For example, during time instants $t_8$, $t_9$, and $t_{10}$, the rotation of the magnetic field is stopped such that field 51 points in a direction corresponding to direction 6 in FIG. 1. As was explained above, stopping the field in position 6 is desirable because it allows more time for the bubble to make the difficult transition from the relatively narrow end of one chevron to the relatively wide end of the next chevron.

Also, inspection of FIG. 5 shows that while the rotating field 51 is stopped in position 6, its magnitude is increased. Specifically, at time instant $t_9$, the magnitude of field 51 reaches a maximum. This also is desirable since as was explained above in conjunction with FIG. 2, the difference $\Delta$ in the attractive forces which chevron ends 20b and 21a generate is proportional to the magnitude of the field when it is in position 6. So, due to this increase in the bubble will move more easily from one chevron to the next.

Further inspection of FIG. 5 shows that the rotating field 51 also stops in direction 4 during time instants $t_5$, $t_6$, and $t_7$; and that it again stops in direction 8 during time instants $t_{11}$, $t_0$, and $t_1$. As was explained above in conjunction with FIG. 3, stopping the field in positions 4 and 8 is desirable because it makes the sampling of the resistance of sensing element 34 much simpler.

In addition, FIG. 5 shows that at time instants $t_6$ and $t_0$, field 51 again reaches a maximum. This is desirable because it has the effect of increasing the width of the striped out bubbles as they lie under sensing element 34. Thus, a greater change in resistance is induced in the sensing element when it is being sampled.

Figure 6:
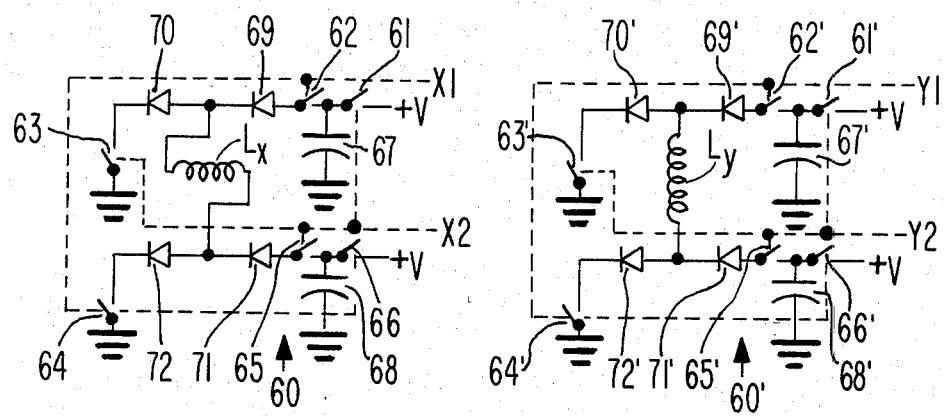
FIG. 6 illustrates a circuit for generating the currents of FIG. 4.
Figure 7:
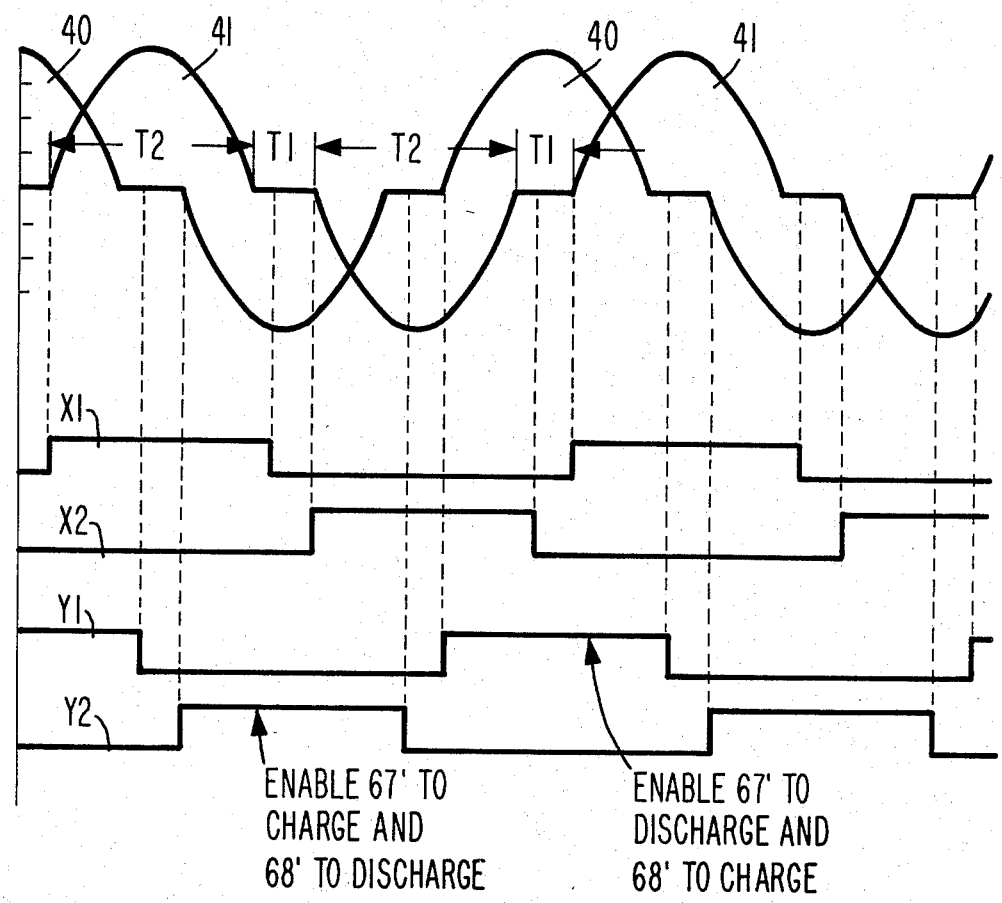
FIG. 7 illustrates a set of logic signals which open and close the switches in the FIG. 6 circuit.

Turning now to FIGS. 6 and 7, a preferred circuit for generating the above described current waveforms 40 and 41 to produce fields 50-52 will be described. This circuit has two symmetrical portions 60 and 60'. Portion 60 operates to generate current waveform 40; while portion 60' operates to generate current waveform 41.

Included in circuit 60 are six switching elements 61-66, two capacitors 67 and 68, and four diodes 69-72. Each of the switching elements 61-66 preferably is completely electrical (such as a bipolar or MOS transistor) but it is shown as an electrical-mechanical switch for simplicity.

In operation, switches 62, 64, and 66 close (become conductive) in response to the high level of a logic signal X1; whereas switches 61, 63, and 65 close in response to the high level of another logic signal X2. Logic signals X1 and X2 can be generated by conventional logic circuitry (which is not shown); however, the novel timing of those signals is shown in FIG. 7.

Switch 61 has an input terminal coupled to receive a supply voltage +V, and it has an output terminal coupled to capacitor 67 which in turn is coupled to ground. Switch 61 also has its output terminal coupled to the input terminal of switch 62 which in turn has its output terminal coupled through diodes 69 and 70 to the input terminal of switch 63; and the output terminal of switch 63 is coupled to ground.

Similarly, switch 66 has an input terminal coupled to receive voltage +V; and it has an output terminal coupled to capacitor 68 which in turn is coupled to ground. Switch 66 also has its output terminal coupled to the input terminal of switch 65 which in turn has its output terminal coupled through diodes 72 and 71 to the input terminal of switch 64; and the output terminal of switch 64 is coupled to ground.

Circuit 60' is identical in construction to circuit 60; and like components are identified by like reference numerals with a prime ('). Also in circuit 60', the switches 62', 64', and 66' close in response to the high level of a logic signal Y1; while the remaining switches 61', 63', and 65' close in response to another logic signal Y2. Signals Y1 and Y2 are shown in FIG. 7.

To complete the circuitry of FIG. 6, the field coil $L_X$ which produces the X component of the rotating field has one terminal coupled between diodes 69 and 70; and has another terminal coupled between diodes 71 and 72. Similarly, the field coil $L_Y$ which produces the Y component of the rotating field has one terminal coupled between diodes 69' and 70', and has another terminal coupled between diodes 71' and 72'.

When signal X1 is high, current flows from capacitor 67 through switch 62, diode 69, inductor $L_X$, diode 72, and switch 64; and at the same time, capacitor 68 will charge to voltage +V. Conversely, when signal X2 is high, current flows from capacitor 68 through switch 65, diode 71, inductor $L_X$, diode 70, and switch 63; and capacitor 67 charges to +V. Circuit 60' operates in a similar fashion in response to logic signals Y1 and Y2.

Also, while signal X1 is high, current can flow through inductor $L_X$ in only one direction. Thus, if signal X1 remains high for a relatively long period of time such that capacitor 67 completely discharges through inductor $L_X$ and recharges with an opposite polarity with current from that inductor, then diodes 69 and 72 prevent capacitor 67 from discharging again through the inductor in an opposite direction. Similarly, diodes 70 and 71 prevent capacitor 68 from discharging current through inductor $L_X$ in an opposite direction.

Thus, while signal X1 is high, the positive going half-sine wave of current waveform 41 is generated. Thereafter, when logic signal X2 goes high, the negative going half-sine wave of waveform 41 is generated. Similarly, when logic signal Y1 is high, the positive going half-sine wave of waveform 40 is generated; and when logic signal Y2 is high, the negative going half-sine wave of waveform 40 is generated. All of this is illustrated in FIG. 7.

The time duration T2 of the positive going half-sine wave in waveform 41 is determined by $T2 = \pi\sqrt{LC}$ where L is inductance of coil $L_X$ and C is the capacitance of capacitor 67. Similarly, the time duration T2 of the negative going half-sine wave in waveform 41 is determined by $T2 = \pi\sqrt{LC}$ where L is the inductance of coil $L_X$ and C is the capacitance of capacitor 68. Again, circuit 60' behaves in a similar fashion.

In generating the logic signals $X_1$, $X_2$, $Y_1$, and $Y_2$, the time duration of their high level need only be longer than period T2. Also, logic signals X1 and X2 must be generated such that they lag logic signals Y1 and Y2 by 90° since, as explained above, current waveform 41 lags current waveform 40 by 90°. Finally, the dwell period T1 is selected simply by adjusting the time between the rising edge of signal X1 and the rising edge of signal X2 to equal the sum of T1+T2.

A preferred method for carrying out the invention as well as the advantages thereof have now been described in detail. In addition, however, many changes and modifications can be made to these details without departing from the nature and spirit of the invention. For example, the current waveform through only one of the field coils $L_X$ (or $L_Y$) may be generated with a dwell period; while the current waveform through the other drive coil may be generated as a continuous sine wave without dwell. In that case, the rotating magnetic field which is generated by the currents in the field coils will stop at only two positions during its rotation. And those two positions can be selected to coincide with the positions where the bubbles cross the gap from one propagate element to another and/or underlie the sensing element in a bubble detector.

Accordingly, since many such modifications to the above details are possible, it is to be understood that the invention is not limited to said details but is defined by the appended claims.

What is claimed is:

1. A method of operating a magnetic bubble memory of the type that includes a plurality of spaced apart propagate elements which define paths along which magnetic bubbles move in a plane in response to a magnetic drive field that rotates in said plane; said method including the steps of:

sending respective currents through a pair of field coils to produce said rotating magnetic fields;

generating at least one of said currents to consist of a series of positive and negative going waveforms separated by a dwell period so that the rotation of said field temporarily stops during said dwell period;

timing said dwell period to occur when said bubbles cross the spaces between said propagate elements;

increasing the magnitude of said field, while it is temporarily stopped, substantially over the largest magnitude which the field has when it is rotating; and moving said bubbles across the spaces between said propagate elements by means of said temporarily stopped field with its substantially increased magnitude without the aid of any other separately generated field.

2. A method according to claim 1 wherein said one current waveform is generated by the out of phase discharging of two capacitors through said field coils with said dwell period occurring between the discharging of said capacitors.

3. A method according to claim 1 wherein the time duration of each dwell period is at least one-ninth of the time duration between consecutive dwell periods.

4. A method according to claim 1 wherein both of said currents consist of a series of positive and negative going waveforms separated by respective dwell periods.

5. A method according to claim 1 wherein said positive and negative going waveforms are positive and negative going half-sine waves.

6. A method of operating a magnetic bubble memory of the type that includes a plurality of magnetic bubbles and a sensing element which changes in resistance when said bubbles move under the sensing element in response to a magnetic drive field that rotates in a plane; said method including the steps of:

sending respective currents through a pair of field coils to produce said rotating magnetic fields;

generating at least one of said currents to consist of a series of positive and negative going waveforms separated by a dwell period so that the rotation of said field temporarily stops during said dwell period;

timing said dwell period to occur when said bubbles are at a position under said sensing element where the sensing occurs;

increasing the magnitude of said field, while it is temporarily stopped, substantially over the largest magnitude which the field has when it is rotating; and widening the bubble under said sensing element by means of said temporarily stopped field with its substantially increased magnitude without the aid of any other separately generated field.

7. A method according to claim 6 wherein said one current waveform is generated by the out of phase discharging of two capacitors through said field coils with said dwell period occurring between the discharging of said capacitors.

8. A method according to claim 6 wherein the time duration of each dwell period is at least one-ninth of the time duration between consecutive dwell periods.

9. A method according to claim 6 wherein both of said currents consist of a series of positive and negative going waveforms separated by respective dwell periods.

10. A method according to claim 6 wherein said positive and negative going waveforms are positive and negative going half-sine waves.

* * * * *